United States Patent
Nallan et al.

(10) Patent No.: US 6,893,893 B2
(45) Date of Patent: May 17, 2005

(54) METHOD OF PREVENTING SHORT CIRCUITS IN MAGNETIC FILM STACKS

(76) Inventors: Padmapani C. Nallan, 2200 Pettigrew Dr., San Jose, CA (US) 95148; Ajay Kumar, 510 Kenilworth Ct., Sunnyvale, CA (US) 94087; Jeng H. Hwang, 20835 Scofield Dr., Cupertino, CA (US) 95014; Guangxiang Jin, 1738 Fumia Dr., San Jose, CA (US) 95131; Ralph Kerns, 890 Regent Ct., San Carlos, CA (US) 94070

( * ) Notice: Subject to any disclaimer, the term of this patent is extended or adjusted under 35 U.S.C. 154(b) by 0 days.

(21) Appl. No.: 10/235,100

(22) Filed: Sep. 4, 2002

(65) Prior Publication Data

US 2003/0180968 A1 Sep. 25, 2003

Related U.S. Application Data

(60) Provisional application No. 60/365,954, filed on Mar. 19, 2002.

(51) Int. Cl.$^7$ ............................................. H01L 21/00
(52) U.S. Cl. ............................. 438/61; 438/3; 438/692; 438/696; 438/695; 438/720; 438/754; 438/73
(58) Field of Search ............................ 438/61, 3, 240, 438/595, 48, 800, 246, 248, 249, 210, 692, 421, 431, 238, 381, 689, 942, 975, 73, 695, 696, 720, 754

(56) References Cited

U.S. PATENT DOCUMENTS

| | | | |
|---|---|---|---|
| 5,496,759 A | 3/1996 | Yue et al. ..................... 437/52 |
| 5,607,599 A | 3/1997 | Ichihara et al. ................ 216/22 |
| 5,732,016 A | 3/1998 | Chen et al. .................. 365/158 |
| 5,920,500 A | 7/1999 | Tehrani et al. .............. 365/173 |
| 5,940,319 A | 8/1999 | Durlam et al. .............. 365/171 |
| 6,024,885 A | 2/2000 | Pendharkar et al. .......... 216/22 |
| 6,048,739 A | 4/2000 | Hurst et al. ..................... 438/3 |
| 6,153,443 A | 11/2000 | Durlam et al. ................. 438/3 |
| 6,165,803 A | 12/2000 | Chen et al. ..................... 438/3 |
| 6,174,737 B1 | 1/2001 | Durlam et al. ................. 438/3 |
| 6,233,172 B1 * | 5/2001 | Chen et al. .................. 365/173 |
| 6,365,419 B1 | 4/2002 | Durlam et al. ................. 438/3 |
| 6,485,989 B1 * | 11/2002 | Signorini ........................ 438/3 |
| 6,656,371 B2 * | 12/2003 | Drewes ...................... 216/22 |
| 6,656,372 B2 * | 12/2003 | Yates .......................... 216/22 |
| 2003/0034324 A1 * | 2/2003 | Ueda et al. .................. 216/22 |

FOREIGN PATENT DOCUMENTS

JP 411112051 A * 4/1999 ......... H01L/21/314

* cited by examiner

*Primary Examiner*—Matthew Smith
*Assistant Examiner*—Igwe U. Anya
(74) *Attorney, Agent, or Firm*—Moser, Patterson & Sheridan LLP; Joseph Bach

(57) ABSTRACT

A method for preventing electrical short circuits in a multilayer magnetic film stack comprises providing a film stack that includes a layer of magnetic material having an exposed surface. A protective layer is deposited on the exposed surface of the magnetic layer. The protective layer may comprise, for example, a fluorocarbon or a hydrofluorocarbon. The film stack is etched and the protective layer protects the exposed surface from a conductive residue produced while etching the film stack. The method may be used in film stacks to form a magneto-resistive random access memory (MRAM) device.

35 Claims, 11 Drawing Sheets

US 6,893,893 B2

METHOD OF PREVENTING SHORT CIRCUITS IN MAGNETIC FILM STACKS

CROSS-REFERENCE TO RELATED APPLICATIONS

This invention claims benefit of U.S. provisional patent application Ser. No. 60/365,954, filed Mar. 19, 2002, which is herein incorporated by reference.

BACKGROUND OF THE INVENTION

1. Field of the Invention

Embodiments of the present invention generally relate to a method for processing magnetic film stacks. More specifically, the invention relates to a method of preventing an electrical short circuit while fabricating magneto-resistive random access memory (MRAM) devices.

2. Description of the Related Art

Microelectronic devices are generally fabricated on a semiconductor substrate as integrated circuits wherein various layers of materials must be deposited and patterned to form the device. An example of such a device is a magneto-resistive random access memory (MRAM) device.

An MRAM typically comprises a multi-layer film or "film stack" that may be processed to form an information storage element. The film stack comprises magnetic materials that are typically etched at high temperature using, for example, a plasma etch process. The plasma may comprise, for example, fluorine or chlorine species. The chlorine or fluorine species may combine with material removed from material layers in the film stack to form a conductive residue that deposits along the sidewalls of the film stack.

The conductive residue may form in various manners. For example, if a layer in the film stack comprises tantalum, a plasma etch process utilizing chlorine ($Cl_2$) may result in the formation of tantalum chloride (TaCl) residue. If a photoresist layer comprising carbon is used to pattern the film stack during the etch process, a metal-containing polymer may also form as an additional residue resulting from the etch process. Alternatively, the residue may result from a by-product of the plasma etchant reacting with the removed material. Generally, the conductive residue that deposits on the sidewalls of the film stack is tenacious and difficult to remove. The conductive residue may form a conductive pathway that acts as an electrical short circuit across layers of the MRAM device, thereby rendering the device inoperable.

Therefore, there is a need in the art for a method of preventing electrical short circuiting in magnetic film stacks such as the film stacks used in magneto-resistive random access memory (MRAM) devices.

SUMMARY OF THE INVENTION

The disadvantages of the prior art are overcome by a method for preventing electrical short circuiting in a multi-layer magnetic film stack. The method comprises providing a film stack that includes a magnetic material that has an exposed surface. A protective layer is deposited on the exposed surface of the magnetic layer. The protective layer may comprise, for example, a fluorocarbon or a hydrofluorocarbon. A conductive residue that is generated from subsequent etching of material layers in the film stack is prevented from contacting the exposed surface of the magnetic layer.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
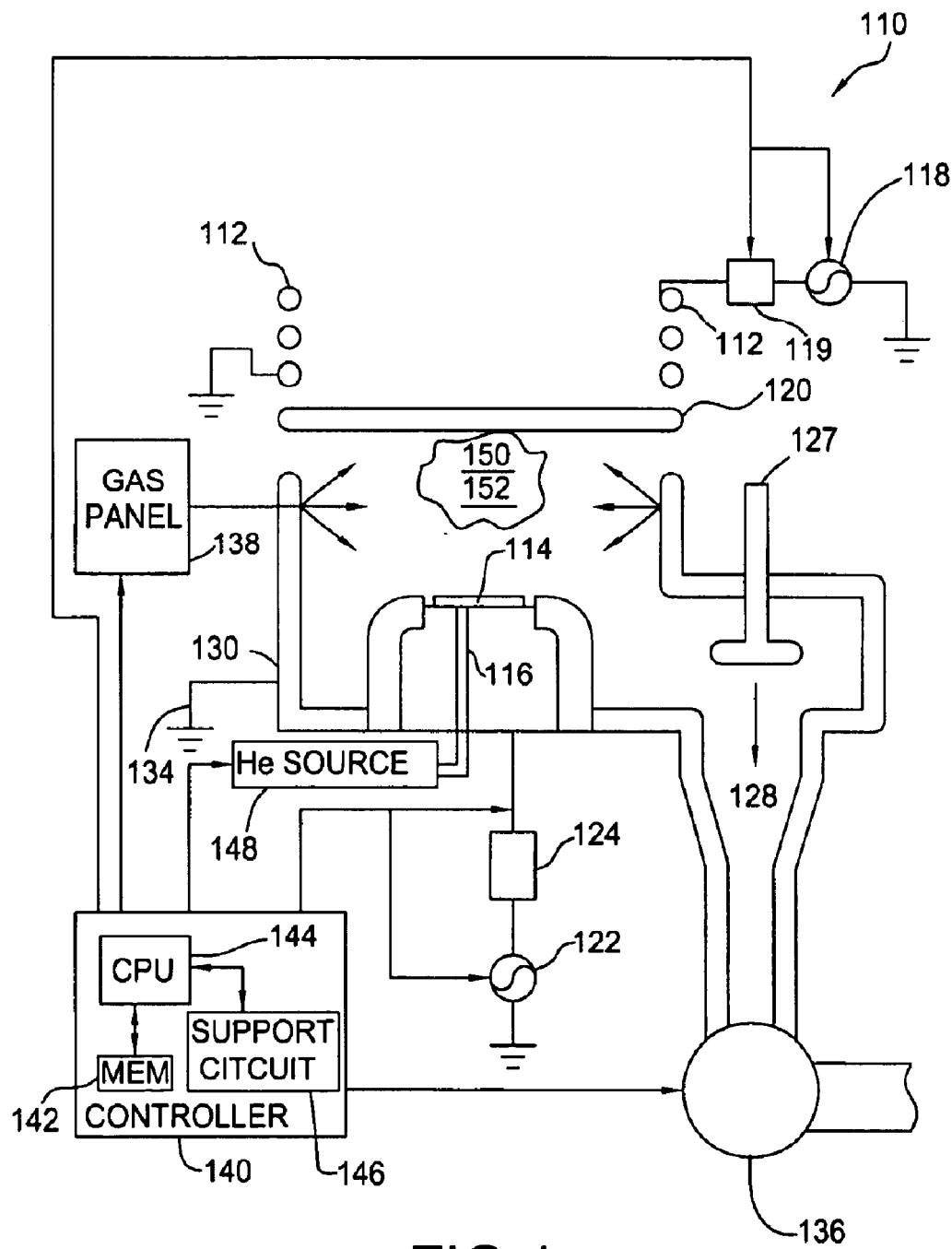
FIG. 1 is a schematic diagram of a plasma processing apparatus that may be used to practice embodiments of the invention described herein.

The present invention generally provides a method of preventing electrical short circuits along the vertical sidewalls of a multi-layer film stack. FIG. 1 depicts a schematic diagram of an etch chamber 110 that may be used to practice embodiments of the invention described herein. The etch chamber may be, for example, a DPS II etch module of the Centura® metal etch system, commercially available from Applied Materials, Inc. of Santa Clara, Calif. The etch chamber 110 comprises at least one inductive coil antenna 112, positioned exterior to a dielectric ceiling 120. The ceiling 120 may be flat, as shown in FIG. 1, or alternatively, the ceiling 120 may have another shape, such as a dome shape. The antenna 112 is coupled to a radio-frequency (RF) source 118 that is generally capable of producing an RF signal having a tunable frequency of about 2 MHz. The RF source 118 is coupled to the antenna 112 through a matching network 119. Process chamber 110 also includes a substrate support pedestal (cathode) 116 that is coupled to a second RF source 122 that is generally capable of producing an RF signal having a frequency of approximately 13.56 MHz. The source 122 is coupled to the cathode 116 through a matching network 124. The chamber 110 also contains a conductive chamber wall 130 that is connected to an electrical ground 134. A controller 140 comprising a central processing unit (CPU) 144, a memory 142, and support circuits 146 for the CPU 144 is coupled to the various components of the etch chamber 110 to facilitate control of the etch process.

In operation, a substrate 114 is placed on the substrate support pedestal 116 and gaseous components are supplied from a gas panel 138 to the process chamber 110 through entry ports 126 to form a gaseous mixture 150. The gaseous mixture 150 is ignited into a plasma 152 in the process chamber 110 by applying RF power from the RF sources 118 and 122 to the antenna 112 and the cathode 116, respectively. The pressure within the interior of the etch chamber 110 is controlled using a throttle valve 127 situated between the chamber 110 and a vacuum pump 136. The temperature at the surface of the chamber walls 130 is controlled using liquid-containing conduits (not shown) that are located in the walls 130 of the chamber 110.

The temperature of the substrate 114 is controlled by stabilizing the temperature of the support pedestal 116 and flowing helium gas from a source 148 to channels formed by the back of the substrate 114 and grooves (not shown) on the pedestal surface. The helium gas is used to facilitate heat transfer between the pedestal 116 and the substrate 114. During the etch process, the substrate 114 is heated by a resistive heater within the pedestal to a steady state temperature and the helium facilitates uniform heating of the substrate 114. Using thermal control of both the ceiling 120 and the pedestal 116, the substrate 114 may be maintained at a temperature of between about −50 and about 500 degrees Celsius.

The RF power applied to the inductive coil antenna 112 has a frequency between 50 kHz and 13.56 MHz and has a power of 200 to 2500 Watts. The bias power applied to the pedestal 116 may be DC or RF and is between about 0 and about 500 Watts.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the chamber as described above, the CPU 144 may be one of any form of general purpose computer processor that can be used in an industrial setting for controlling various chambers and sub-processors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etching process is generally stored in the memory 142 as a software routine. The software routine may also be stored and/or executed by a second CPU (not shown) that is remotely located from the hardware being controlled by the CPU 144.

The software routine is executed after a wafer 114 is positioned on the pedestal 116. The software routine when executed by the CPU 144, transforms the general purpose computer into a specific purpose computer (controller) 140 that controls the chamber operation such that the etching process is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

Method of Preventing Electrical Short Circuits

Figure 2A:
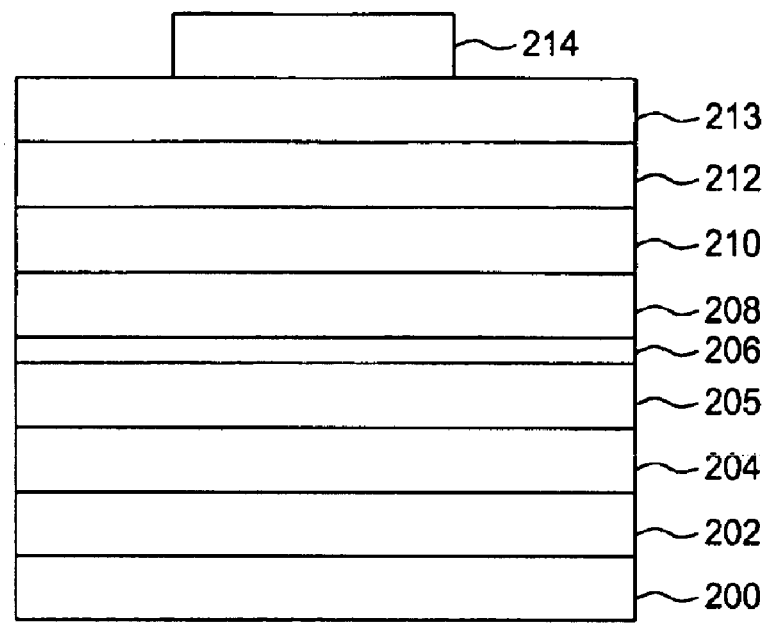
FIGS. 2A–2J are cross-sectional views of a film stack during different stages of an integrated circuit processing sequence consistent with one example of an embodiment of the invention described herein.
Figure 2B:
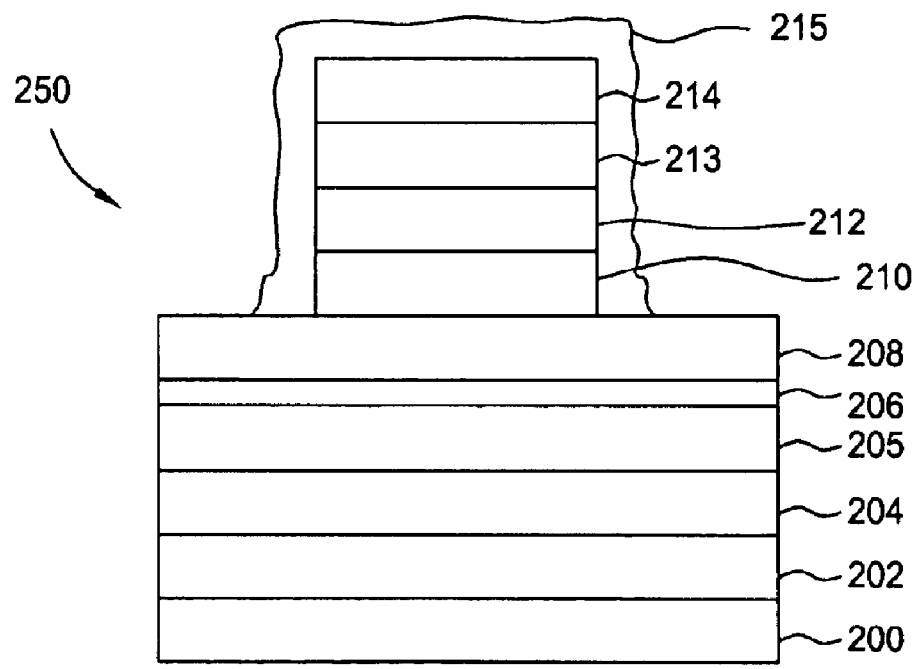

FIGS. 2A–2J are cross-sectional views of a film stack 220 during different stages of an MRAM device fabrication sequence. As shown in FIG. 2A, the multi-layer film stack 220 is formed on a substrate 200. The material layers shown in FIGS. 2A–2J and FIGS. 3A–3J are not depicted to scale. Depending on the specific stage of processing, the substrate 200 may correspond to, for example, a silicon wafer, or other material layer, which has been formed on the silicon wafer. The film stack 220 comprises a series of material layers (not drawn to scale in FIGS. 2A–2J) formed in succession: a photoresist layer 214, a bottom anti-reflection coating (BARC) layer 213, a hard mask layer 212, a first conductive layer 210, a first magnetic layer 208, a tunnel barrier or tunneling layer 206, a second magnetic layer 205, a pinning layer 204, and a second conductive layer 202. The first magnetic layer 208, the tunneling layer 206, and the second magnetic layer 205 collectively represent a magneto-resistive sensing element or magnetic tunnel junction (MTJ) 211. The film stack 220, once patterned to form a magneto-resistive random access memory device, is typically used to magnetically encode or store information.

The first conductive layer 210 and the second conductive layer 202 generally function as electrodes and may comprise, for example, tantalum (Ta) or tantalum nitride (TaN) and each may have a thickness of about 50 to about 600 Angstroms. The first magnetic layer 208 and the second magnetic layer 205 comprise a magnetic material, such as a ferromagnetic material. The ferromagnetic material may include materials such as nickel and cobalt iron alloys, such as CoFe, NiFe and the like, and may comprise one or more sub-layers of combinations of these alloys. The first magnetic layer 208 generally has a thickness of about of about 50–100 Angstroms, and the second magnetic layer 205 generally has a thickness of about 300–400 Angstroms. The pinning layer 204, which may comprise, for example, an alloy of platinum (Pt) and manganese (Mn), generally functions to maintain a magnetic state of the first magnetic layer 208 oriented in a specific direction.

The tunneling layer 206 is an electrically insulating layer of material, comprising, for example, alumina ($Al_2O_3$) and may have a thickness, of about 10–15 Angstroms. The hard mask layer 212 may comprise, for example, an oxide, such as silicon dioxide. The hard mask layer 212 may have a thickness of about 500 Angstroms.

The BARC layer 213 is positioned between the photoresist layer 214 and the hard mask layer 212 in order to control reflections from the underlying first conductive layer 210 and thereby reduce the tendency of inaccuracies from developing when the pattern is transferred from the photoresist layer 214. The BARC layer 213 may comprise, for example, inorganic materials such as silicon nitride, silicon oxynitride, titanium nitride, silicon carbide, and the like, or organic materials such as polyamides and polysulfones. The layers 213 and 214 together have a thickness of about 6000 Angstroms. The photoresist layer 214 may be a conventional photosensitive layer used for the patterning of integrated circuits, including material layers used in MRAM devices. The various layers that comprise the film stack 220 may be deposited using vacuum deposition techniques such as chemical vapor deposition (CVD), plasma enhanced chemical vapor deposition (PECVD), physical vapor deposition (PVD), atomic layer deposition (ALD), among other methods.

The photoresist layer 214 may be conventionally processed by applying photoresist to the substrate 200, exposing the photoresist through a mask, and developing the photoresist to form the photoresist layer 214.

The BARC layer 213, the hard mask layer 212, and the first conductive layer 210 are plasma etched using either a chlorine-based or fluorine-based chemistry (e.g., $CF_4/CHF_3/$Ar and the like). In one embodiment of the invention, the first magnetic layer 208 is used as an etch stop layer. Alternatively, etching may be terminated upon a certain optical emission occurring (e.g., at wavelength of about 3630 Angstroms), upon a particular duration occurring, or upon some other indicator determining that the first conductive layer 210 has been removed. During this etching step, some amount of the etched metal (e.g., tantalum) from the first conductive layer 210 may combine with components (for example, chlorine ($Cl_2$) or fluorine (F)) of the etchant and by-products of the etching process and form a residue 215. The residue 215 contaminates the side walls 250 of the film stack 220.

Etching of the BARC layer 213, the hard mask 212 and the first conductive layer 210 may be performed in a Decoupled Plasma Source (DPS) II module of the Centura® system, such as the chamber 110 of FIG. 1. The DPS II module uses a 2 MHz inductive plasma source to generate and sustain high density plasma. A wafer is biased by a 13.56 MHz bias source. The decoupled nature of the plasma source allows independent control of ion energy and ion density. The DPS II module provides a wide process window over changes in source and bias power, pressure, and etch gas chemistry and uses an endpoint system to determine an end of the etch process.

More specifically, etching of the BARC layer 213, the hard mask 212 and the first conductive layer 210 may comprise supplying between 10 sccm and 200 sccm of Argon, between 10 sccm and 200 sccm of $CF_4$, applying power to an inductively coupled antenna between 200 Watts and 3000 Watts, applying a cathode electrode bias power between 0 Watts and 500 Watts, and maintaining a substrate temperature between 10 degrees Celsius and 80 degrees Celsius as well as a pressure in the reactor between 1 mTorr and 30 mTorr. One specific process recipe provides 60 sccm of $CF_4$, 60 sccm of Ar, applying 1000 Watts to the antenna and 50 Watts to the cathode electrode, and maintaining a substrate temperature at 45 degrees Celsius and a pressure in the reactor at 10 mTorr.

Figure 2C:
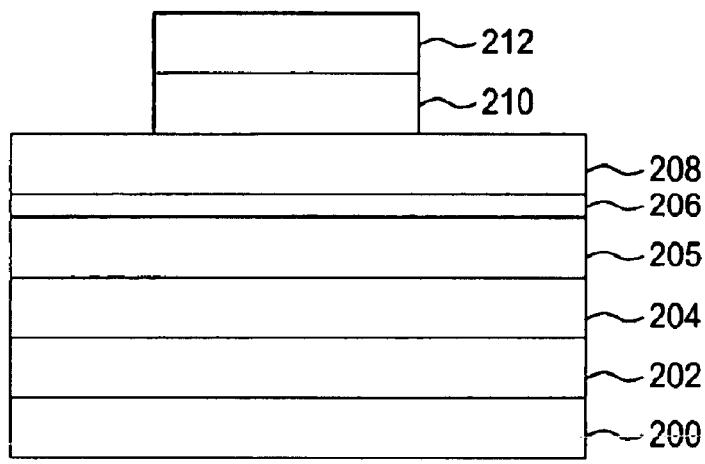

As shown in FIG. 2C, the residue 215 is removed. In one embodiment of the invention the residue 215 is removed using a wet dip process in which a wet dip solution comprising ammonium hydroxide ($NH_4OH$), $H_2O_2$ (hydrogen peroxide), and $H_2O$ contacts the substrate 200 for a period of about 1 to 2 minutes at a temperature between about 45 degrees Celsius to about 75 degrees Celsius. The ammonium hydroxide ($NH_4OH$) and $H_2O_2$ and deionized water may be present in a ammonium hydroxide ($NH_4OH$): $H_2O_2$: $H_2O$ ratio from about 1:1:10 to about 4:1:10.

In an alternative embodiment of the invention, to remove the residue 215, the substrate 200 is dipped in a hydrogen fluoride solution. The HF solution comprises hydrogen fluoride and deionized water. In particular, the HF solution comprises between 0.1 to 10% of hydrogen fluoride by weight. When used to dissolve the residue 215, the HF solution has a temperature between 10 to 30 degrees Celsius. Duration of the wet dip in the HF solution is generally between 1 and 10 minutes. In one embodiment of the invention, after plasma etching a film comprising tantalum using a chlorine-containing chemistry, the substrate was cleaned using the hydrogen fluoride solution comprising about 1% of HF by weight, at a temperature of about 20 degrees Celsius, and for a duration of about 3 minutes. During the wet dip in the HF solution, the metallic components are removed from the residue 215. In addition, the HF solution partially dissolves the residue 215 and, as such, the residue 215 weakens after the wet dip and becomes easier to be stripped during a subsequent plasma stripping process.

The wet dip processes may be performed in a single wafer cleaning module. One illustrative example of such cleaning module is discussed with respect to FIG. 4.

After the wet dip process, the photoresist layer 214 and the BARC layer 213 as well as any of the residue 215 that remains after the wet dip, are stripped. This stripping process may be performed, for example, in the Advanced Strip and Passivation (ASP) module of the Centura® system. The ASP module is a microwave downstream oxygen plasma reactor in which the plasma is confined to a plasma tube and only reactive neutrals are allowed to enter a process chamber. Such a plasma confinement scheme precludes plasma-related damage of the substrate 200 or circuits formed on the substrate. In the ASP module, backside of the substrate 200 is heated radiantly by quartz halogen lamps and the wafer temperature can be maintained between 20 to 400 degrees Celsius. A duration of a stripping process is generally between 30 and 120 seconds.

In one embodiment of the invention, the layers 213 and 214 are removed in the ASP module by supplying between 500 and 5000 sccm of $O_2$, between 0 and 1000 sccm of $N_2$, applying between 200 to 3000 Watts to excite a plasma, and maintaining a wafer temperature between 150 to 400 degrees Celsius and a pressure in the reactor between 1 to 10 Torr. In this embodiment of the invention, the best results were observed with the oxygen-based reactant gas. One specific process recipe provides 3500 sccm of $O_2$, 300 sccm of $N_2$, applies 1400 Watts to excite a plasma, and maintains a wafer temperature at 200 degrees Celsius and a pressure in the reactor at 2 Torr.

Alternatively, removal of the layers 213 and 214 may be performed in the DPS II module such as the etch chamber 110 of FIG. 1. In one embodiment of the invention, in the DPS II chamber, the layers 213 and 214 are removed by supplying between 50 and 200 sccm of $O_2$, between 0 and 50 sccm of $N_2$, applying power to an inductively coupled antenna about 1000 Watts, applying a cathode electrode bias power about 10 Watts, and maintaining a wafer temperature about 40 degrees Celsius and a pressure in the reactor about 30 mTorr for a duration of about 120 seconds. In this embodiment of the invention, a duration of the stripping process is between 30 and 120 seconds. After the stripping procedure, the substrate 200 may be wet dipped in a solvent such as EKC 265 to remove traces of the photoresist layer 214 and the residue 250. EKC 265 is commercially available from EKC Technology, Inc., of Danville, Calif.

Figure 2D:
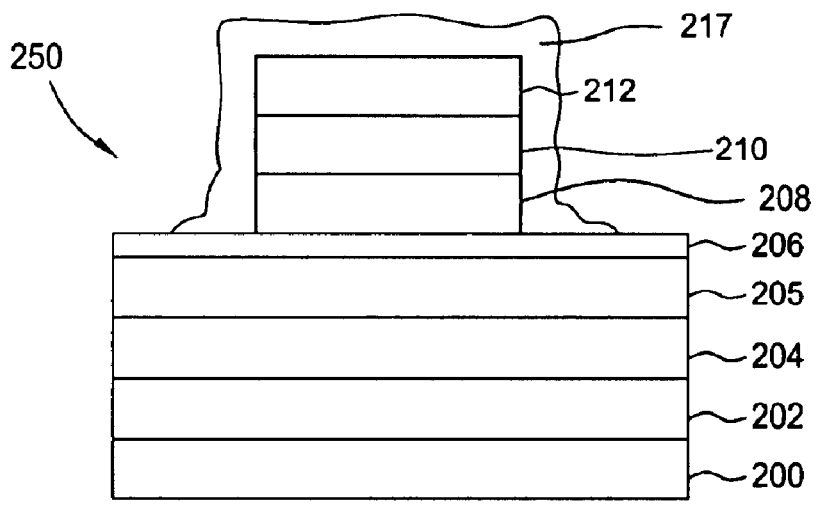

As shown in FIG. 2D, the first magnetic layer 208 is plasma etched using an oxygen and chlorine based chemistry, for example, $Cl_2/Ar/O_2$ and the like. In such a chemistry, oxygen improves selectivity of the etchant to $Al_2O_3$. In one embodiment of the invention when the tunneling layer 206 is formed from $Al_2O_3$, the tunneling layer serves as an etch stop layer. During the etching of the first magnetic layer 208, the etched metal from the layer 208 may combine with components of the etchant and by-products of the etching process to form a residue 217. The residue 217 may contain, for example, metallic-oxides or metallic-chlorides. The residue 217 contaminates the sidewalls 250 of the film stack 220, a top of the hard mask 212 where it forms a veil, and may also rest elsewhere on the substrate 200. The residue 217 may combine with the residue 215 that may inadvertently remain after the wet dip and plasma stripping process discussed above. The residue 217 represents a contaminant with respect to further fabrication of a MRAM device and should be removed.

The etching of the first magnetic layer 208 may be performed, in a DPS II module of the Centura® system. In one embodiment of the invention, the first magnetic layer 208 is etched in the DPS II module by supplying between 10 and 50 sccm of $O_2$, between 10 and 100 sccm of $Cl_2$, between 10 and 100 sccm of Ar, applying power to an inductively coupled antenna between 200 to 3000 Watts, applying a cathode electrode bias power between 0 to 300 Watts, and maintaining a wafer temperature between 40 to 500 degrees Celsius and a pressure in the reactor between 1 to 20 mTorr. One specific process recipe provides 20 sccm of $O_2$, 40 sccm of $Cl_2$, 20 sccm of Ar, applying 900 Watts to the antenna and 100 Watts to the cathode electrode, and maintaining a wafer temperature at 40 degrees Celsius and a pressure in the reactor at 5 mTorr.

Figure 2E:
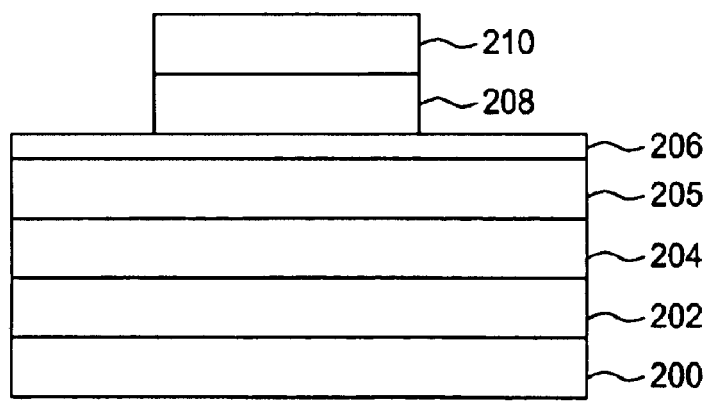

As shown in FIG. 2E, the residue 217 and the hard mask 212 are removed using a buffered oxide etch (BOE) process followed by a rinse in a distilled water. In one exemplary embodiment of the invention, the BOE process comprises a wet dip of the wafer 200 in a solution of hydrogen fluoride (HF) and deionized water (DI). After the wet dip in the HF/DI solution, the substrate 200 is rinsed in a distilled water to remove any remaining traces of the BOE etchant. In one embodiment of the invention, a solution of hydrogen fluoride in DI comprising between 0.1 and 10% of hydrogen fluoride by weight is applied at a temperature between 10 and 30 degrees Celsius, for a duration between about 10 and 20 seconds, though longer exposures of up to about 120 seconds may be utilized. One specific process recipe provides a solution comprising HF having 1% of HF by weight at a temperature of 30 degrees Celsius, for a duration of 15 seconds.

Figure 2F:
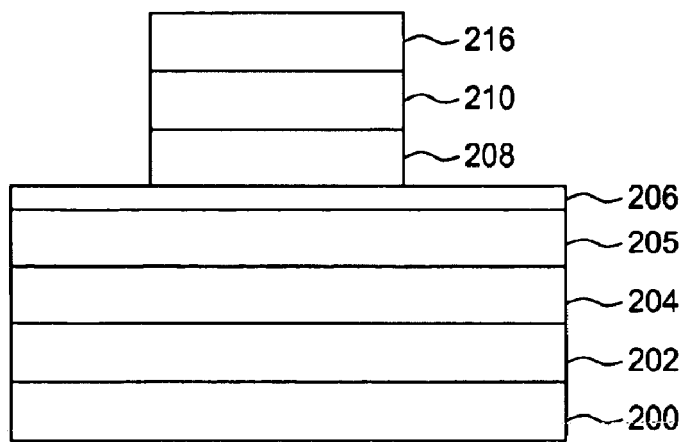

As shown in FIG. 2F, a second hard mask layer 216 is formed on the first conductive layer 210. The second hard mask layer 216 may have a composition similar to the hard mask layer 212. The second hard mask layer 216 may be patterned and etched by forming a second photoresist layer and a second BARC layer (both not shown), patterning and etching the second photoresist layer and the second BARC layer, and etching the second hard mask layer 216 in a chlorine-based or fluorine-based etchant and in a manner similar to that discussed above for etching the hard mask layer 212. The second photoresist layer and second BARC layer are then stripped in a manner similar to as discussed above, with reference to FIG. 2C. No deleterious residue is generated during the etching of the second hard mask 216, since etching the hard mask layer 212 is not accompanied by etching a conductive layer such as the first conductive layer 210 that was etched previously with reference to FIG. 2B and 2C.

Figure 2G:
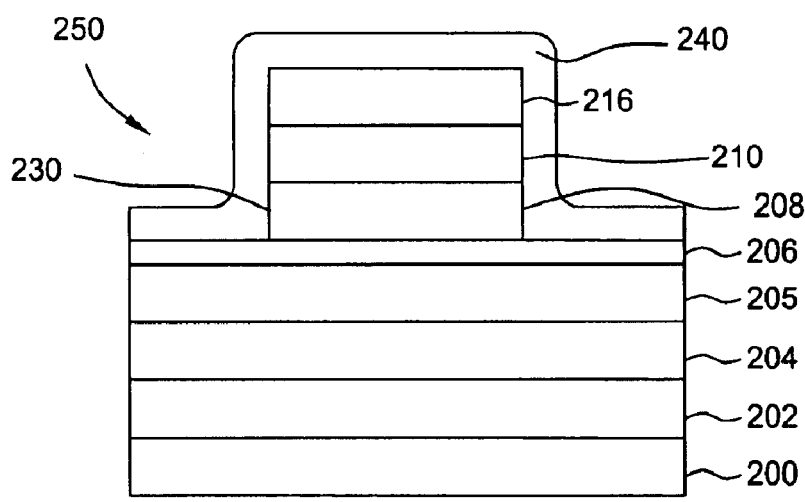

As shown in FIG. 2G, a protective layer 240 is deposited on the stack 220 such that an exposed surface (sidewall 230) of the first magnetic layer 208 is coated with the protective layer 240. The protective layer 240 may be formed as shown in FIG. 2G such that it conformally coats the sidewall 230 of the first magnetic layer 208 as well as the sidewalls 250 of material layers formed atop the first magnetic layer 208 as well as a top surface 260 of the hard mask layer 212.

The protective layer 240 comprises a material that is generally an insulator. The protective layer 240 may comprise, for example, a polymerized fluorocarbon, a polymerized hydrofluorocarbon, and the like.

The protective layer 240 may be deposited in an etch chamber such as the etch chamber 110 described above. To maximize process throughput, the protective layer 240 may be deposited "in-situ," i.e., in the same chamber used to etch some or all of the material layers, in the stack 220.

In one embodiment of the inventive method, the deposition of the protective layer 240 comprises applying bias power to the pedestal 116, supplying one or more process gases into the chamber 110, regulating the pressure of the process gases, applying RF power and forming a plasma, controlling the substrate temperature, and depositing the protective layer 240. These process steps need not be performed sequentially. For example, some or all of the steps may be performed simultaneously to deposit the protective layer 240.

A bias power in a range of about 5 to about 100 watts (W) may be applied to the pedestal 116. The at least one process gas supplied to the chamber 110 may include at least one source of carbon and hydrogen, at least one source of carbon and fluorine, or at least one source of carbon, hydrogen, and fluorine. In one embodiment of the invention, the at least one process gas comprises a gas selected from the group consisting of $C_4F_8$, $CF_4$, $CHF_3$, $C_2F_6$, or combinations thereof. The process gases may be admitted to the chamber 110 with a flow rate in a range of about 10 standard cubic centimeters per second (sccm) to about 500 sccm. The pressure of the one or more process gases may be regulated such that the pressure is maintained in a range of about 2 millitorr (mTorr) to about 100 mTorr. A source power that is applied to the antenna 112 may be in a range of about 200 W to about 2500 W. The temperature of the pedestal 116 may be maintained in range from about −50° C. to about 100° C. The protective layer 240 may be deposited to a thickness in a range from about 50 Angstroms to about 500 Angstroms.

Figure 2H:
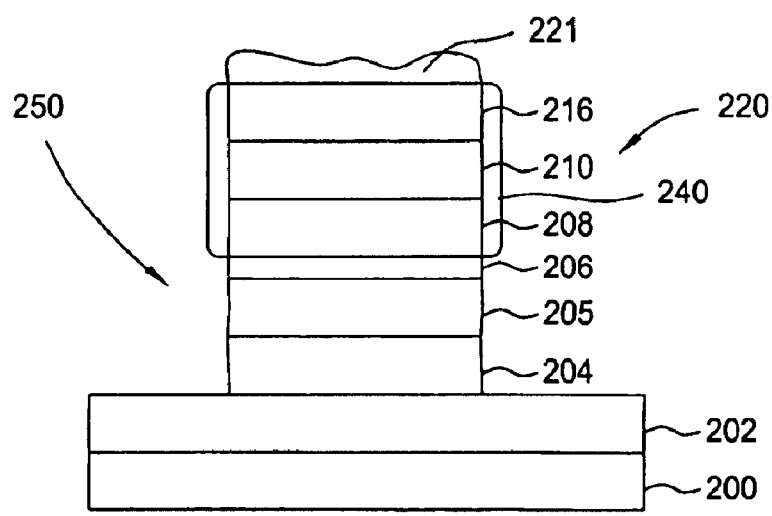

As shown in FIG. 2H, after depositing the protective layer 240, etching of the tunneling layer 206, the second magnetic layer 205 and the pinning layer 204 is performed using for example, a boron chloride ($BCl_3$) chemistry (for example, $Ar/BCl_3$ and the like) as an etchant. Because the tunneling layer is very thin, portions of the tunneling layer 206 may have been removed during the previous processing steps, such as during the etching of the first magnetic layer 208.

In one exemplary embodiment, the second magnetic layer 205 and the pinning layer 204 comprise, from top to bottom, a series of sub-layers of CoFe, Ru, CoFe, PtMn or IrMn, NiFe, and NiFeCr. The hard mask 216 is used as an etch mask and the second conductive layer 202 as an etch stop layer. Because the etch process is substantially anisotropic, the etching of the tunneling layer 208, the second magnetic layer 205 and the pinning layer 204 may remove the protective layer 240 from the top surface of the films stack 220, but does not substantially remove the protective layer 240 from the sidewall 250.

Etching of the second magnetic layer 205 and the pinning layer 204 may be performed in a DPS II module of the Centura® system by supplying between 10 and 200 sccm of $BCl_3$ and between 10 and 200 sccm of Ar, applying power to an inductively coupled antenna between 200 to 3000 Watts, applying a cathode electrode bias power between 0 to 600 Watts, and maintaining a wafer temperature between 45 to 250 degrees Celsius and a pressure in the reactor between 1 to 50 mTorr. One specific process recipe provides 20 sccm of $BCl_3$, 80 sccm of Ar, applying 700 Watts to the antenna and 150 Watts to the cathode electrode, and maintaining a wafer temperature at 80 degrees Celsius and a pressure in the reactor at 5 mTorr.

Some by-products of the etching process that have a low volatility may produce a metal-containing residue 221. The residue 221 typically is removed from the sidewalls 250 during the etching process, but may form on the top surface of the etch stop layer 216, as shown in FIG. 2H. The residue 221 need not be removed before proceeding with the next step in the process.

Figure 2I:
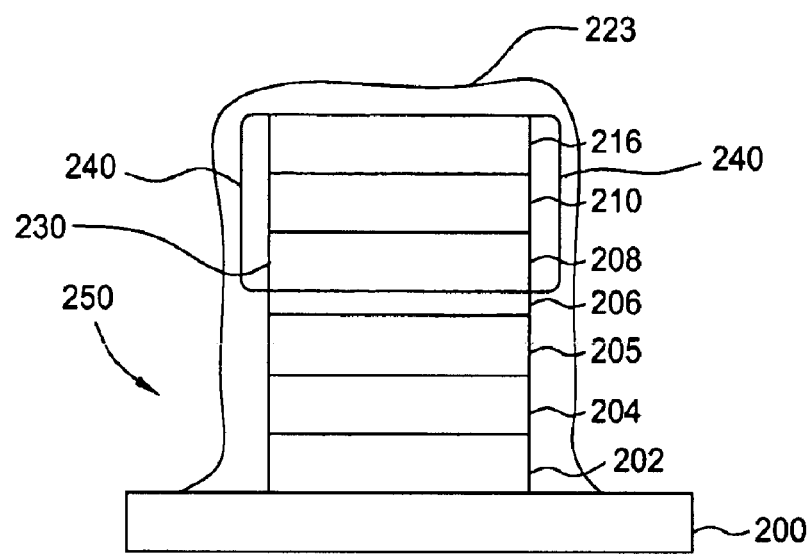

As shown in FIG. 2I, the second conductive layer 202 is etched using a $Cl_2$ based etchant such as $Cl_2/Ar$ and the like. In one embodiment of the invention, the second conductive layer 202 is etched using the hard mask 216 (e.g., $SiO_2$) as an etch mask and a barrier layer (not shown) that may be formed between the substrate 200 and the second conductive layer 202 as an etch stop layer. The etch process may be performed in a DPS II module of the Centura® system by supplying between 10 and 200 sccm of $Cl_2$ and between 10 and 200 sccm of Ar, applying power to an inductively coupled antenna between 200 to 3000 Watts, applying a cathode electrode bias power between 0 to 300 Watts, and maintaining a wafer temperature between 45 to 250 degrees Celsius and a pressure in the reactor between 1 to 50 mTorr. One specific process recipe provides 50 sccm of $Cl_2$, 50 sccm of Ar, applying 1000 Watts to the antenna, applying 50 Watts to the cathode electrode, and maintaining a wafer temperature at 80 degrees Celsius and a pressure in the reactor at 5 mTorr.

While the above process depicts one etch process to etch the tunneling layer 206, the second magnetic layer 205, and the pinning layer 204 that is followed by a separate etch process to etch the second conductive layer 202, in an alternative embodiment, these etch processes may be combined in a single step in which the tunneling layer 206, the second magnetic layer 205, the pinning layer 204 and the second conductive layer 202 are etched using a $Cl_2$ based chemistry and stopping on, for example, the barrier layer.

Figure 2J:
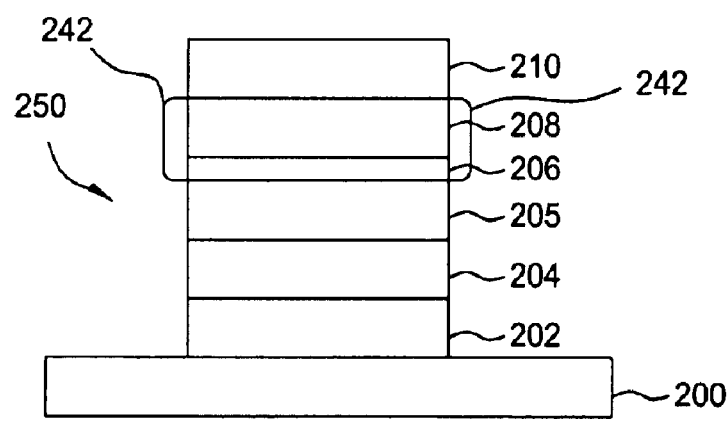

The etching of the second conductive layer 202 may generate a residue 223 that is typically electrically conductive and may comprise, for example, tantalum. The protective layer 240 protects the exposed surface (e.g., a sidewall 230) of the first magnetic layer 208 from the residue 223, thereby preventing the formation of short circuits across the tunneling layer 206. The residue 223 may be removed, as shown in FIG. 2J, using a wet dip process in which the substrate 200 is dipped in a mixture of $NH_4OH$, $H_2O_2$, and $H_2O$ (such as SC1 solvent, commercially available from Rhodia, Inc. of Freeport, Tex.) at a temperature of about 45 degrees Celsius to about 65 degrees Celsius. The solvent may comprise about 0.1 to about 10 parts of ammonium hydroxide, 0.1 to about 10 parts of hydrogen peroxide, and about 1 to about 100 parts of deionized water. After treating the residue 223 with the solvent, the substrate 200 may be rinsed in DI water. In an alternative embodiment of the invention, the residue 223 and the hard mask layer 212 may be removed using, for example, a BOE process, similar to the BOE processes described above.

Additionally, some or all of the protective layer 240 may be removed from the stack 220 using, for example, a fluorine-based plasma or other conventional etching means. Removing at least some of the protective layer 240 may facilitate removal of the residue 223 from the films stack 220.

Alternatively, the protective layer 240 may be intentionally left on the film stack 220. Furthermore, because the protective layer 240 protects the film stack 220 from short circuiting, the residue 223 has no effect upon the function of the tunnel junction. As such, some or all of the residue 223 may be intentionally left on the sidewall 250 of the film stack. In one embodiment of the invention, at least a portion 242 of the protective layer 240 is not removed from the film stack 220.

While the above description details the deposition of the protective layer 240 after etching the first magnetic layer 208 and before etching the tunneling layer 206, the deposition of the protective layer 240 may be performed at another point during the processing of the film stack 220. For example, in an alternative embodiment of the invention, as depicted in FIGS. 3A–3J, the protective layer 240 is deposited after etching the second magnetic layer 205 and before etching the pinning layer 204.

Figure 3A:
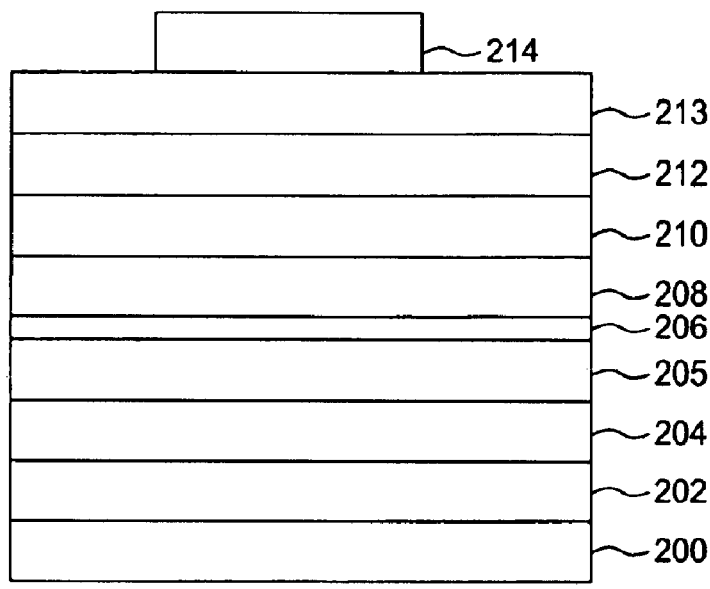
FIGS. 3A–3J are cross-sectional views of a film stack during different stages of an integrated circuit processing sequence consistent with one example of an alternative embodiment of the invention described herein.
Figure 3B:
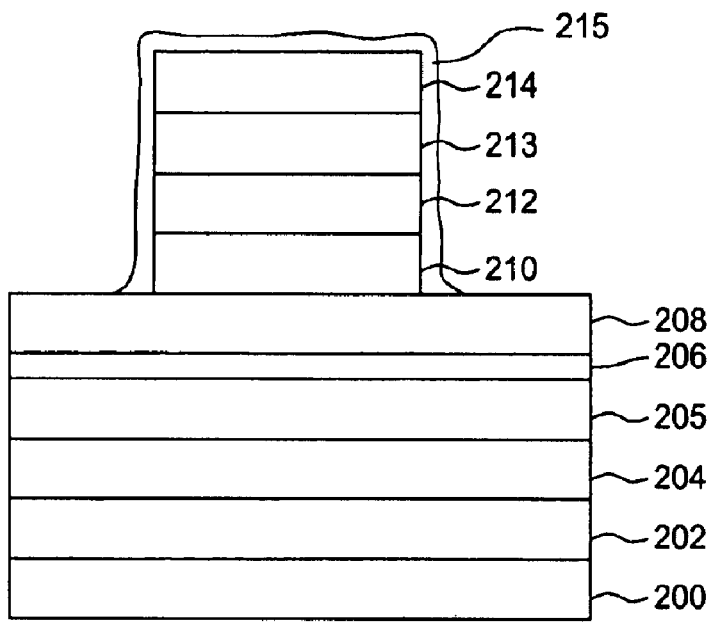
Figure 3C:
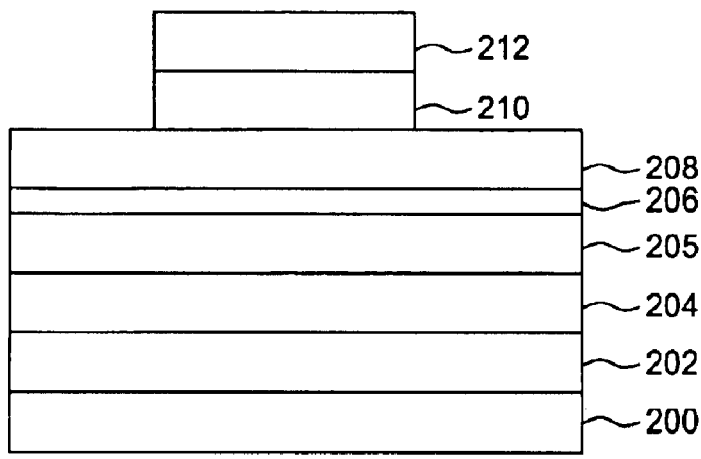
Figure 3D:
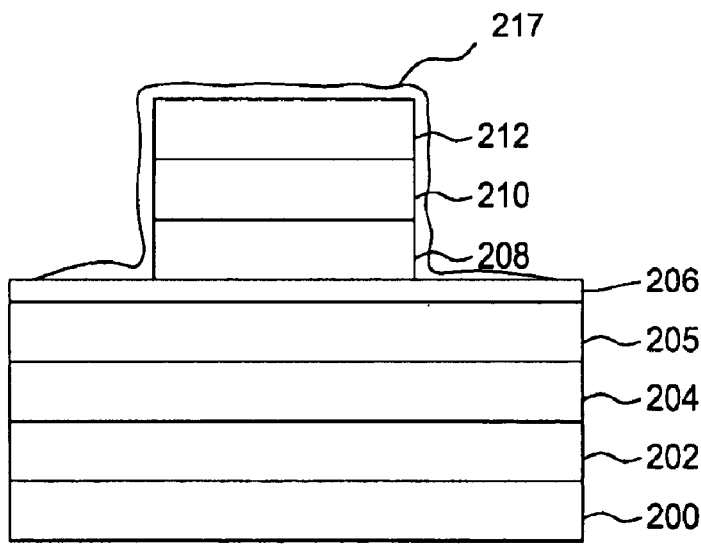
Figure 3E:
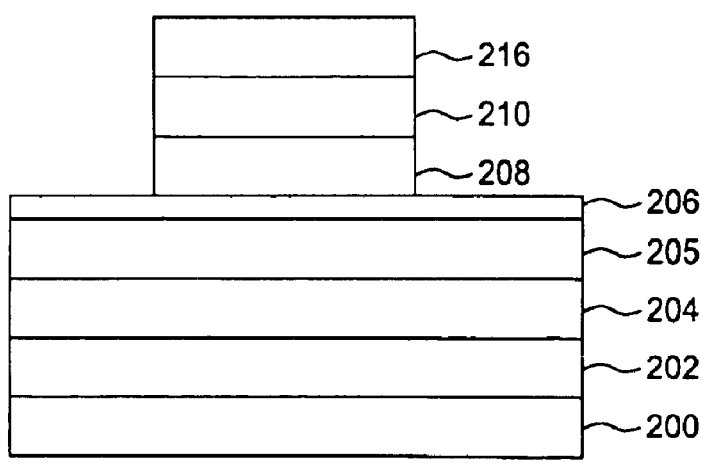
Figure 3F:
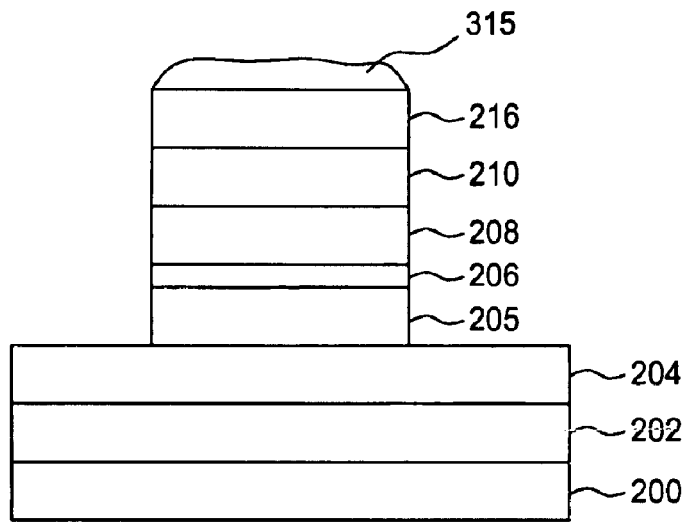

Referring to FIG. 3A, the film stack 220 comprises, the second conductive layer 202, the pinning layer 204, the second magnetic layer 205, the tunneling layer 206, the first magnetic layer 208, the first conductive layer 210, the hard mask layer 212, the BARC layer 213 and the photoresist layer 214. As shown in FIG. 3B, the hard mask layer 212, the BARC layer 213, and the first conductive layer 210 are etched forming the residue 215. Then the BARC 213 and the photoresist layer 214 as well as the residue 215 are removed (FIG. 3C). The first magnetic layer 208 is etched, stopping on the tunneling layer 206 and forming the residue 217 (FIG. 3D). The residue 217 and the hard mask 212 are removed and the second hard mask layer 216 is formed (FIG. 3E). The processing steps shown in FIGS. 3A–3E are performed in a manner similar to the corresponding steps shown in FIGS. 2A–2F and described above. As shown in FIG. 3F, the tunneling layer 206, and the second magnetic layer 205 are then etched using the hard mask layer 216 and using a $BCl_3$ etch process, that may be performed using similar etch conditions as the etch process discussed with reference to FIG. 2H. The etch is stopped on the pinning layer 204 (i.e., the pinning layer is used as an etch stop layer). This etching of the tunneling layer 206 and the second magnetic layer 205 generates a residue 315 that may, for example, have a composition similar to the residue 221 described above. The $Ar/BCl_3$ plasma chemistry in-situ removes the residue from the sidewalls, however, a residue 315 may remain on top of the second hard mask 216. Nevertheless, the residue 315 on the hard mask 216 is not detrimental to performing the deposition of the protective layer 240, described below.

Figure 3G:
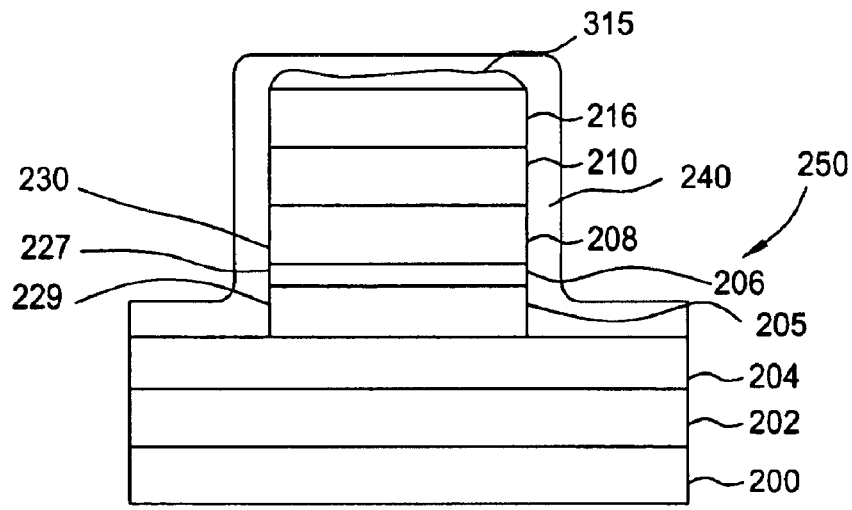

As indicated in FIG. 3G, the protective layer 240 is deposited on the exposed surface (e.g., sidewalls 250) of the film stack 220, such as the exposed sidewall 230 of the first magnetic layer 208, an exposed sidewall 229 of the second magnetic layer 205, and an exposed sidewall 227 of the tunneling layer 206, as shown in FIG. 3G.

The protective layer 240 is deposited using a deposition method similar (i.e. similar gases, similar pressures, similar source and bias powers, as well as a similar pedestal temperature) to the method discussed above with reference to FIG. 2G. Specifically, the protective layer 240 may be formed such that it conformally coats the sidewall 230 of the first magnetic layer 208 as well as the sidewalls 227 of the tunneling layer 206, and the sidewall 229 of the second magnetic layer 205. The protective layer 240 may be deposited over the residue 315 as well. The protective layer 240 generally has a composition that is similar to the composition described above with reference to FIG. 2G, and may be deposited "in-situ," i.e., in the same chamber, such as the chamber 110, used to etch some or all of the material layers, in the stack 220.

Figure 3H:
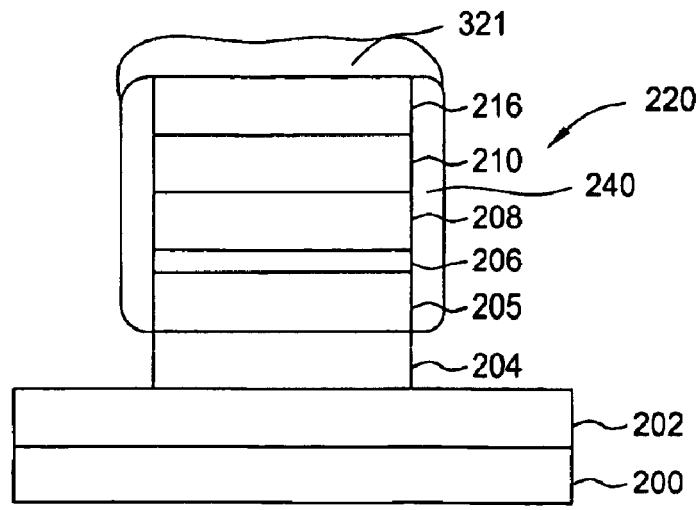
Figure 3I:
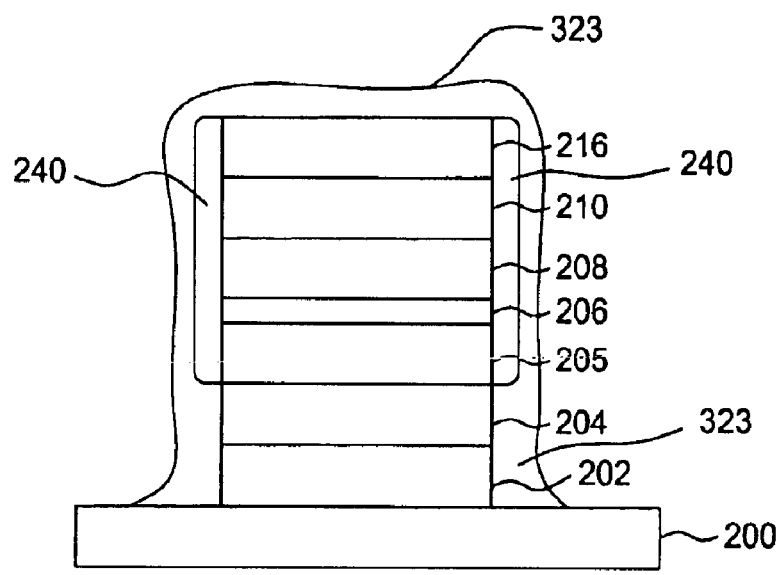
Figure 3J:
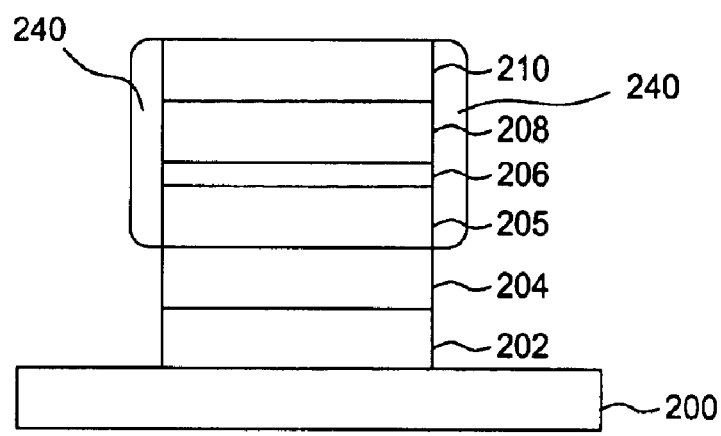

As indicated in FIG. 3H, the pinning layer 204 is then etched using an etch process similar to the etch process used to etch layers 208, 206, and 205 (shown in FIG. 3F), stopping on the second conductive layer 202. The etching of the pinning layer 204 may generate a residue 321 that may incorporate portions of the residue 315. The second conductive layer 202 is then etched as shown in FIG. 3I, using, for example, a chlorine-based etchant. A residue 323 that may incorporate the residue 321 is formed on the film stack. The residue 323, (which may comprise, for example, tantalum) as well as the protective layer 240 may be removed as discussed above with reference to FIG. 2, or portions of the residue 323 and or protective layer 240 may be intentionally left on the film stack 220. In this embodiment of the invention, the protective layer 240 protects the sidewalls 250, such as the sidewalls 227, 229, and 230 of the film stack 220 from the residue 323. As such, a short circuit across the magneto-resistive junction is prevented.

Figure 4:
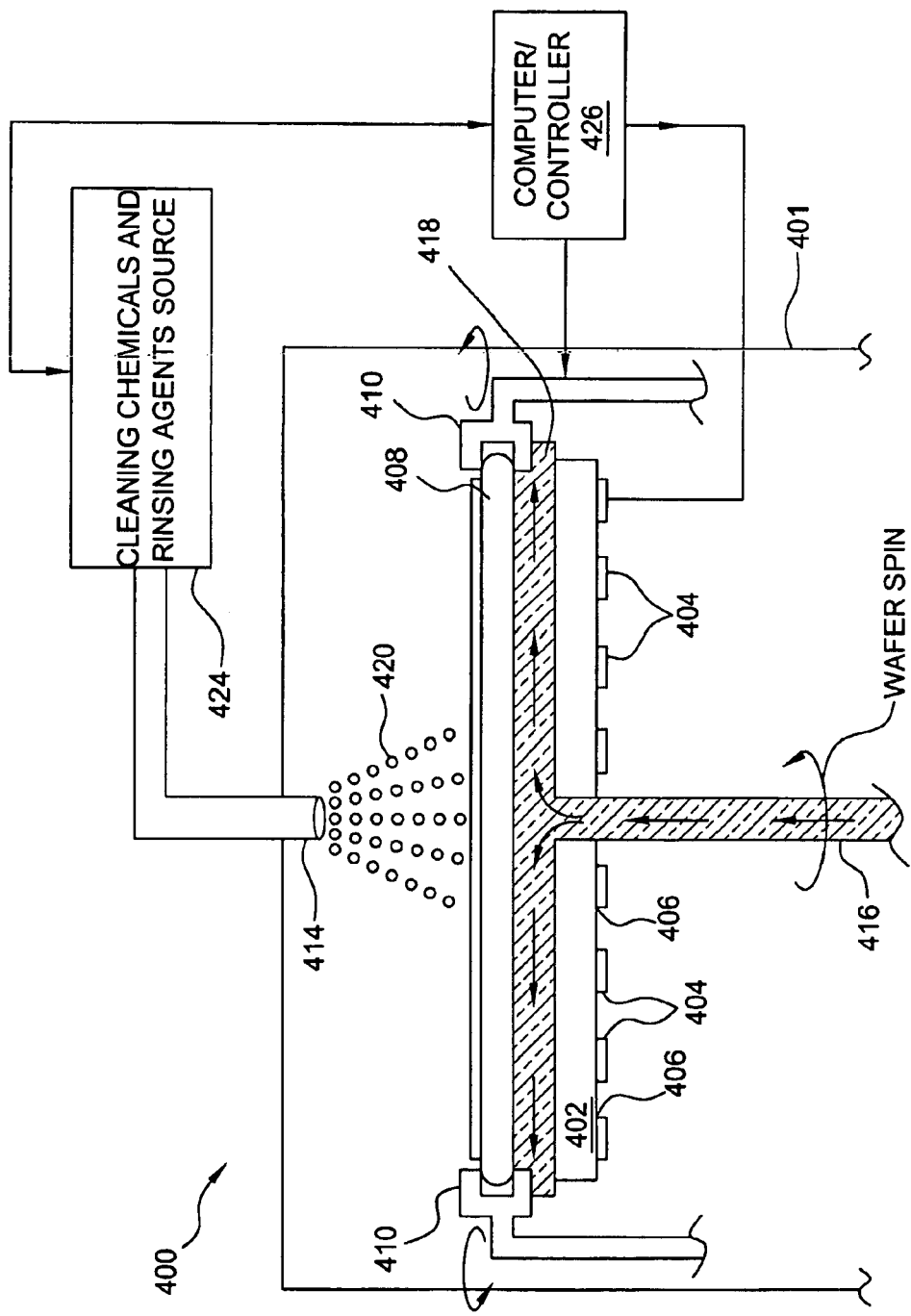
FIG. 4 depicts a schematic, cross-sectional view of one embodiment of a wet cleaning module that may be used to practice embodiments of the invention.

The method of the present invention cleans the substrate by dipping the substrate into a cleaning solution (cleaning chemicals and/or rinsing agents). One embodiment of an apparatus for cleaning a substrate is a single substrate wet cleaning module. FIG. 4 depicts a simplified cross-sectional view of an illustrative embodiment of a single substrate wet cleaning module 400. The module 400 is described in detail in U.S. patent application Ser. No. 09/945,454, filed Aug. 31, 2001 (attorney docket number 4936), which is herein incorporated by reference.

The module 400 applies cleaning chemicals and/or rinsing agents to the top and bottom of a substrate. To enhance the cleaning process, the module 400 uses acoustic or sonic waves to agitate the cleaning chemicals and/or rinsing agents.

The module 400 comprises a chamber 401, a nozzle 414, and a substrate support 412. The substrate support is mounted within the chamber 401 and comprises edge clamps 410, plate 402 and a plurality of acoustic or sonic transducers 404. The plate 402 has a shape that is substantially the same as a substrate and supports the plurality of acoustic or sonic transducers 404. The plate 402 is, for example, made of aluminum, but can be formed of other materials such as, but not limited to, stainless steel and sapphire. The plate 402 is coated with a corrosion resistant fluoropolymer such as HALAR or PFA. The transducers 404 are attached to the bottom of the plate 402 using an adhesive, for example, an epoxy 406. In one embodiment of the cleaning module 400, the transducers 404 are arranged in an array that covers substantially the entire bottom surface of plate 402, e.g., approximately 80% of plate 402. The transducers generate sonic waves in the frequency range between 400 kHz and 8 MHz. In one embodiment of the module 400, the transducers are piezoelectric devices.

The plurality of edge clamps 410 retain the substrate 408 face up above the plate 408 to form a gap 418 between the backside of the wafer and the top surface of the plate 402. The gap 418 is approximately 3 mm. Cleaning chemicals and/or rinsing agents are provides to the gap via channel 416. The clamps are rotated to cause the substrate 408 to rotate about its central axis at a rate between 0 and 6000 rpm. In this embodiment of module 400, the substrate 408 and clamps 410 rotate, while the plate 402 is stationary.

The nozzle 414 sprays cleaning chemicals and/or rinsing agents upon the top of the substrate 408 (i.e., the surface of the substrate comprising features, transistors, or other circuitry). As the nozzle 414 sprays the top of the substrate 408, the same or different cleaning chemicals and/or rinsing agents are supplied to the gap 418 via channel 416 as the substrate is rotated such that the cleaning chemicals and/or rinsing agents flow across the top and bottom surfaces of the substrate.

The nozzle 414 and channel 416 are coupled to a source 424 of cleaning chemicals and/or rinsing agents. The source 424 may be the same for the nozzle 414 and channel 416, or a separate source may be couple to each of the nozzle 414 and channel 416. In the present embodiment of the invention, the module 400 is used to clean the substrate 408 using, for example, $NH_4OH$, $H_2O_2$, deionized water, buffered oxide etch (BOE) chemicals, solvents such as EKC 265, and the like.

A computer controller 426 is generally used to control the operation of the module 400. Specifically, the computer controller 426 controls the rotation of the substrate support 412, the activation of the transducers 404, the supply of cleaning chemicals and/or rinsing agents, and so on.

Figure 5:
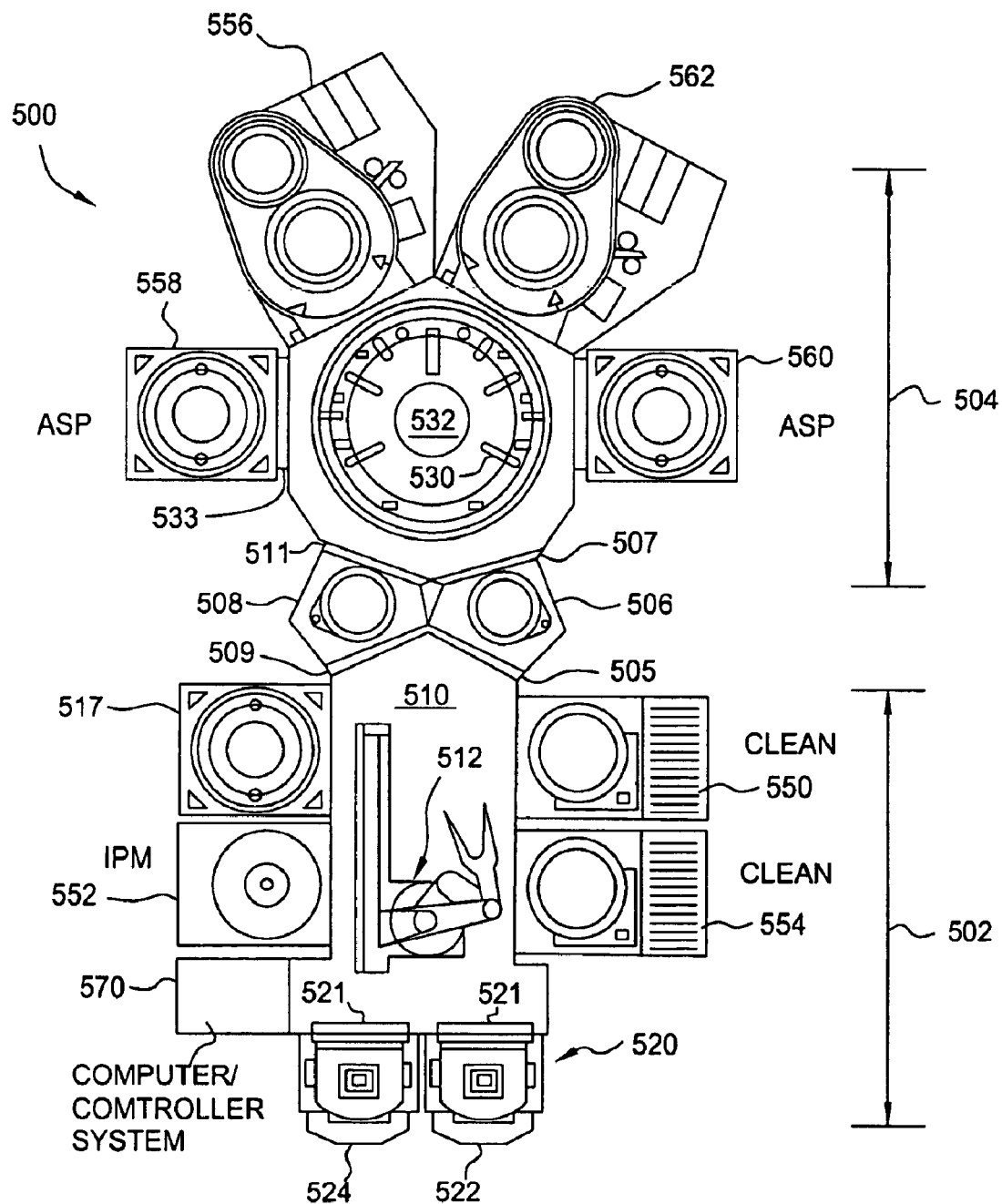
FIG. 5 depicts a schematic view of one embodiment of an integrated platform that may be used to practice embodiments of the invention.

The method of the present invention is illustratively performed on an integrated processing platform 500 shown in FIG. 5 that comprises apparatus for performing both atmospheric and sub-atmospheric processing. The platform 500 and the various modules and tools that can be used with such a platform are described in detail in U.S. patent application Ser. No. 09/945,454, filed Aug. 31, 2001, which is herein incorporated by reference.

Depending upon the process modules that are used in the platform 500, the platform 500 (also referred to as a process tool) can be used to perform etching, substrate cleaning, photoresist stripping, substrate inspection and the like. The platform 500 comprises an atmospheric platform 502 and a sub-atmospheric platform 504. The sub-atmospheric platform 504 and the atmospheric platform 502 may be coupled together by a single substrate load lock 506 or, as shown in the depicted example, are coupled together by a pair of single load locks 506 and 508. In some applications, the sub-atmospheric and atmospheric platforms 504 and 502 are not coupled together and may be used separately. One such stand-alone platform configuration may contain photoresist stripping modules and wet cleaning modules from providing a platform that performs post-etch processing.

The atmospheric platform 502 comprises a central atmospheric transfer chamber 510 containing a substrate handling device 512, such as a robot. Directly attached to the atmospheric transfer chamber 510 is a substrate wet cleaning module 550, an integrated particle monitor 552 and a critical dimension (CD) measuring tool 554. A strip or dry clean module 517 can also be attached to the atmospheric transfer chamber 510, if desired. Each module or tool is coupled to the transfer chamber 510 by a separately closable and sealable opening, such as a slit valve. The transfer chamber is maintained at substantially atmospheric pressure during operation. The substrate handling device 512 is able to transfer substrates from one module or tool to another module or tool that is attached to the atmospheric transfer chamber 510. In the embodiment shown, the substrate handling device 512 is a dual blade, single arm, single wrist robot. Other types of robots may be used to access the various modules and tools.

The atmospheric transfer chamber 510 is coupled to at least one substrate input/output module 520 that provides and receives substrates to and from the platform 500. In one embodiment of the platform 500, the module 520 comprises at least one front opening unified pod (FOUP). Two FOUPs 522 and 524 are depicted. The substrate handling device 512 accesses each FOUP through a sealable access door 521. The substrate handling device 512 moves linearly along a track 523 to facilitate access to all of the modules and tools.

The atmospheric transfer chamber 510 is coupled to the pair of load locks 506 and 508 through sealable doors 505 and 509 such that the substrate handling device 512 can access the load locks 506 and 508. The sub-atmospheric platform 504 comprises a central sub-atmospheric transfer chamber 530 and a plurality of process chambers 556, 558, 560, and 562. Sealable doors 507 and 511 respectively couple each load lock 506 and 508 to the sub-atmospheric transfer chamber 530. The sub-atmospheric transfer chamber 530 contains a substrate handing device 532, such as a robot, that accesses the load locks 506 and 508 as well as the process chambers 556, 558, 560 and 562. The process chambers 556, 558, 560 and 562 are each coupled to the sub-atmospheric transfer chamber 530 via separately closable and sealable openings, such as slit-valves. The process chambers 556, 558, 560 and 562 may comprise one or more etching chambers such as the DPS II chamber depicted in FIG. 1. Additionally, one or more photoresist stripping chambers such as the ASP chamber described above may be used as one or more of the process chambers 556, 558, 560 and 562. As described above, the ASP chamber, if used, may be located either on the sub-atmospheric platform 504 or the atmospheric platform 502. FIG. 5 shows the sub-atmospheric platform 504 comprising two etch chambers 558 and 560 and two photoresist stripping chambers 556 and 562. The sub-atmospheric platform 504 is, for example, a CENTURA platform available for Applied Materials, Inc. of Santa Clara, Calif.

The platform 500 also includes a system computer 570 that is coupled to and controls each module that is coupled to the atmospheric and sub-atmospheric platforms 502 and 504, controls the substrate handling devices 512 and 532, and controls the load locks 506 and 508. Generally, the system computer 570 controls all aspects of operation of the platform 500 either by direct control of the sub-systems, modules, tools and apparatus or by controlling the computers associated with those sub-systems, modules, tools and apparatus. The system computer 570 enables feedback from one module or tool to be used to control the flow of substrates through the platform 500 and/or control the processes or operation of the various modules and tools to optimize substrate throughput.

While the foregoing is directed to embodiments of the present invention, other further embodiments of the invention may be devised without departing from the scope thereof, and the scope thereof is determined by the claims that follow.

What is claimed is:

1. A method of preventing electrical short circuits in a multi-layer film stack, comprising:

providing a film stack comprising a first magnetic layer, wherein the first magnetic layer has an exposed sidewall;

depositing a protective layer of at least one of polymerized fluorocarbon and polymerized hydrofluorocarbon on the exposed sidewall; and etching the film stack, wherein the protective layer protects the exposed sidewall from a conductive residue produced while etching the film stack.

2. The method of claim 1 wherein the film stack further comprises a tunneling layer formed between the first magnetic layer and a second magnetic layer.

3. The method of claim 1 wherein the first magnetic layer comprises a ferromagnetic material.

4. The method of claim 3 wherein the first magnetic layer comprises a material selected from the group consisting of cobalt, iron, nickel, and combinations thereof.

5. The method of claim 1 wherein the deposition of the protective layer comprises:

flowing one or more process gases into a chamber; and
igniting the one or more process gases into a plasma.

6. The method of claim 1 further comprising removing the conductive residue.

7. The method of claim 1 further comprising removing at least portions of the protective layer.

8. The method of claim 1 wherein the protective layer is formed using a plasma of a gas selected from the group consisting of $C_4F_8$, $CF_4$, $CHF_3$, $C_2F_6$, or combinations thereof.

9. A method of preventing electrical short circuits in a multi-layer film stack, comprising:

providing a film stack comprising a first magnetic layer having an exposed sidewall, a tunneling layer having an exposed sidewall and a second magnetic layer having an exposed sidewall;

depositing a protective layer on the exposed sidewalls; and etching the film stack, wherein the protective layer protects the exposed sidewalls of the tunneling layer, the second magnetic layer and the first magnetic layer from contact with the conductive residue produced while etching the film stack.

10. A method of preventing electrical short circuits in a multi-layer film stack, comprising:

providing the film stack comprising a first magnetic layer;
etching the first magnetic layer to form an exposed sidewall;

depositing on the sidewall or the first magnetic layer a protective layer of at least one of polymerized fluorocarbon and polymerized hydrofluorocarbon; and etching the film stack, wherein the protective layer protects the sidewall from conductive residue produced while etching the film stack.

11. The method of claim 10 wherein the film stack further comprises a tunneling layer formed between the first magnetic layer and a second magnetic layer.

12. The method of claim 10 wherein the first magnetic layer comprises a material selected from the group consisting of cobalt, iron, nickel, and combinations thereof.

13. The method of claim 10 wherein depositing the protective layer and etching at least a portion of the film stack are performed in the same chamber.

14. The method of claim 10 wherein depositing the protective layer comprises applying a radio frequency power in a range of about 200 to about 2500 Watts to an inductive coil antenna.

15. The method of claim 10 wherein depositing the protective layer comprises applying a radio frequency bias power in a range of about 5 to about 100 Watts to a substrate support.

16. The method of claim 10 wherein depositing the protective layer comprises maintaining a pressure in a range from about 2 to about 100 mTorr.

17. The method of claim 10 wherein depositing the protective layer comprises maintaining a temperature in a range of about −50 to about 100 degrees Celsius.

18. The method of claim 10 wherein depositing the protective layer is formed using a plasma of a gas selected from the group consisting of $C_4F_8$, $CF_4$, $CHF_3$, $C_2F_6$, or combinations thereof.

19. The method of claim 18 wherein a flow rate of the at least one process gas is in a range of about 10 sccm to about 500 sccm.

20. The method of claim 10 further comprising removing the conductive residue.

21. The method of claim 10 further comprising removing at least a portion of the protective layer.

22. The method of claim 10 wherein etching the film stack comprises igniting at least one process gas into a plasma.

23. The method of claim 10 wherein the film stack further comprises a second magnetic layer having an exposed surface, and wherein the protective layer protects the exposed surface of the second magnetic layer and the exposed surface of the first magnetic layer from contact with the conductive residue produced while etching the film stack.

24. A method of processing a multi-layer film stack for a magnetoresistive storage device in an etch chamber, comprising:

providing a film stack within the etch chamber, wherein the film stack comprises a first magnetic layer and a second magnetic layer spaced apart from the first magnetic layer by a tunneling layer;

etching the film stack to form an exposed sidewall of the first magnetic layer, an exposed sidewall of the second magnetic layer, and an exposed sidewall of a tunneling layer;

within the etch chamber, depositing a protective layer on the exposed sidewall of the first magnetic layer, the exposed sidewall of the second magnetic layer and the exposed sidewall of the tunneling layer; and within the etch chamber, etching additional portions of the film stack, wherein the protective layer protects the exposed sidewall of the first magnetic layer, the exposed sidewall of the second magnetic layer, and the exposed sidewall of a tunneling layer from contact with a conductive residue produced while etching the additional portions of the film stack.

25. The method of claim 24 wherein the first magnetic layer comprises a material selected from the group consisting of cobalt, iron, nickel, and combinations thereof.

26. The method of claim 24 wherein the deposition of the protective layer comprises applying a radio frequency power in a range of about 200 to about 2500 Watts to an inductive coil antenna.

27. The method of claim 24 wherein the deposition of the protective layer comprises applying a radio frequency bias power in a range of about 5 to about 100 Watts to a substrate support located within the chamber.

28. The method of claim 24 wherein the deposition of the protective layer comprises maintaining a pressure in a range from about 2 to about 100 mTorr in the etch chamber.

29. The method of claim 24 wherein the deposition of the protective layer comprises maintaining a temperature in a range of about −50 to about 100 degrees Celsius in the chamber.

30. The method of claim 24 wherein the deposition of the protective layer comprises introducing at least one process gas comprising carbon and fluorine.

31. The method of claim 24 wherein at least one process gas is provided to the chamber at a flow rate in a range of about 10 sccm to about 500 sccm.

32. The method of claim 24 wherein the protective layer comprises a material selected from the group consisting of fluorocarbons, hydrofluorocarbons, and combinations thereof.

33. A method of preventing electrical short circuits in a multi-layer film stack, comprising:

providing a film stack comprising a first magnetic layer and a tunneling layer, wherein the first magnetic layer has an exposed sidewall and the tunneling layer has an exposed surface;

depositing a protective layer on the exposed sidewall, wherein the protective layer comprises at least one of polymerized fluorocarbon and polymerized hydrofluorocarbon; and etching the film stack, wherein the protective layer protects the exposed surface of the tunneling layer and the exposed surface of the first magnetic layer from contact with the conductive residue produced while etching the film stack.

34. A method of preventing electrical short circuits in a multi-layer film stack, comprising:

providing the film stack comprising a first magnetic layer and an underlying tunneling layer;

etching the first magnetic layer to form an exposed sidewall;

etching the tunneling layer to form an exposed sidewall; and depositing a protective layer protecting said sidewalls from conductive residue produced while etching the film stack, wherein the protective layer comprises at least one of polymerized fluorocarbon and polymerized hydrofluorocarbon.

35. The method of claim 34, wherein the film stack further comprises a second magnetic layer disposed beneath the tunneling layer and having an exposed sidewall.

* * * * *

UNITED STATES PATENT AND TRADEMARK OFFICE
CERTIFICATE OF CORRECTION

PATENT NO. : 6,893,893 B2  Page 1 of 1
APPLICATION NO. : 10/235100
DATED : May 17, 2005
INVENTOR(S) : Nallan et al.

It is certified that error appears in the above-identified patent and that said Letters Patent is hereby corrected as shown below:

In column 14, line 12, in Claim 10, delete "or" and insert -- of --.

Signed and Sealed this

Twelfth Day of June, 2007

JON W. DUDAS
*Director of the United States Patent and Trademark Office*

UNITED STATES PATENT AND TRADEMARK OFFICE
CERTIFICATE OF CORRECTION

PATENT NO. : 6,893,893 B2
APPLICATION NO. : 10/235100
DATED : May 17, 2005
INVENTOR(S) : Nallan et al.

Page 1 of 1

It is certified that error appears in the above-identified patent and that said Letters Patent is hereby corrected as shown below:

On the title page, in column 1, below field (76), insert -- Assignee: Applied Materials, Inc., Santa Clara, CA (US). --

Signed and Sealed this

Twenty-ninth Day of April, 2008

JON W. DUDAS
*Director of the United States Patent and Trademark Office*